United States Patent [19]

Ichimura

[11] Patent Number: 5,706,308
[45] Date of Patent: Jan. 6, 1998

[54] SIGNAL PROCESSING APPARATUS AND METHOD FOR SIGMA-DELTA MODULATED SIGNALS INCLUDING GAIN ADJUSTMENT

[75] Inventor: Gen Ichimura, Tokyo, Japan

[73] Assignee: Sony Corporation, Tokyo, Japan

[21] Appl. No.: 753,004

[22] Filed: Nov. 19, 1996

[30] Foreign Application Priority Data

Nov. 29, 1995 [JP] Japan ................................. 7-311427

[51] Int. Cl.[6] ............................................. H04B 14/06
[52] U.S. Cl. ............................................. 375/247; 341/143
[58] Field of Search ............................. 375/247, 244, 375/254; 341/143

[56] References Cited

U.S. PATENT DOCUMENTS 4,851,841  7/1989  Sooch ........................ 375/247
5,245,344  9/1993  Sooch ........................ 375/247

Primary Examiner—Stephen Chin
Assistant Examiner—Betsy L. Deppe
Attorney, Agent, or Firm—Jay H. Maioli

[57] ABSTRACT

A signal processing apparatus in which the effective dynamic range information for maintaining linearity of an output signal is appended to a transmitted 1-bit digital signal as ancillary data. When the 1-bit signal is converted into a multi-bit digital signal, the gain of the 1-bit signal is adjusted on the basis of the effective dynamic range information.

4 Claims, 4 Drawing Sheets

SIGNAL PROCESSING APPARATUS AND METHOD FOR SIGMA-DELTA MODULATED SIGNALS INCLUDING GAIN ADJUSTMENT

BACKGROUND OF THE INVENTION

1. Field of the Invention

This invention relates to a signal processing apparatus for transmitting a digital data string having sigma-delta modulated 1-bit data as main data.

1. Description of the Related Art

As a method for digitizing audio signals, a method known as a sigma-delta ($\Sigma\Delta$) method has become known (see for example Y. Yamazaki "AD/DA Converter and Digital Filter", in Journal of Japan Society of Acoustics, Vol. 46, No. 3 (1990), pp. 251–257).

The 1-bit digital data, obtained by this $\Sigma\Delta$ modulation, is represented by a sampling frequency significantly higher (such as 44.1 kHz times 64) and a data word length significantly shorter (such as 1 bit) than those of the data format hitherto used for conventional digital audio (such as the sampling frequency of 64 kHz and the data word length of 16 bits) and is characterized by a broad transmission frequency range. By this $\Sigma\Delta$ modulation, a high dynamic range can be secured in an audio range which is an extremely low frequency range as compared to the 64-tuple oversampling frequency. This feature can be exploited for recording or data transmission with high sound quality.

The $\Sigma\Delta$ modulation circuit itself is not a new technique and is frequently used in the inside of an A/D converter since the circuit structure can be easily designed as an IC and lends itself with ease to high precision A/D conversion.

The $\Sigma\Delta$ modulated signal can be re-converted into an analog audio signal by being passed through a simple analog low-pass filter.

Meanwhile, if the 1-bit digital audio data, $\Sigma\Delta$ modulated at the same rate, is transmitted or recorded, the practically usable dynamic range differs with respect to a particular analog to digital converter or a $\Sigma\Delta$ modulator actually employed. With the conventional modulation with 44.1 kHz of the sampling frequency and 16 bit word length, the maximum level is the 16-bit full data without dependency on the A/D converter employed As for the maximum level in case the conventional A/D converter is applied to a $\Sigma\Delta$ modulator, it is necessary to downsample the 64×44.1 kHz sampling frequency and a 1-bit word length to 44.1 kHz sampling frequency and 16-bit word length. In this case, as disclosed in U.S. Pat. No. 4,851,841 entitled "Gain Scaling of oversampled Analog-to-Digital Converters", the level used is not up to the maximum level that can be represented with 1 bit by characteristics of the $\Sigma\Delta$ modulator, but the gain is lowered by a downsampling filter. This technique is termed gain scaling, wherein the dynamic range is scaled to approximately 80% of the maximum level that can be represented with 1 bit.

This scaling is required for overcoming the problem such that, if an input signal is in excess of this range, an output is suddenly distorted or the noise is increased, The point at which this occurs differs with respect to the analog-to-digital converter employed, such that it becomes necessary to use a proper value of the gain lowering of the downsampling filter to the analog-to-digital converter employed.

Therefore, it cannot be known up to which level 0 dB optimally holds if only the 1-bit digital audio data outputted by the $\Sigma\Delta$ modulator is resorted to.

Moreover, there are occasions in which the reference level is modified, as when the 1-bit digital audio data is re-converted into 1-bit digital audio data by operation on amplitude or on frequency response or when plural 1-bit digital audio data are mixed together and subsequently re-converted to the 1-bit digital audio data, In these cases, it cannot be known which level should be used as a reference for 0 dB if only the 1-bit digital audio data is resorted to.

SUMMARY OF THE INVENTION

It is therefore an object of the present invention to provide a signal processing apparatus whereby the dynamic range for which a 1-bit data outputted by a $\Sigma\Delta$ modulator can be used may be known by a simplified structure.

The present invention provides a signal processing apparatus for processing a digital data string formed by a synchronization signal, subdata and $\Sigma\Delta$ modulated main data formed by a 1-bit digital signal, having a sampling frequency equal to m×fs (Hz), where m is a positive integer larger than 1 (m>1). The signal processing apparatus includes data separating means for separating the main data and the subdata from the transmitted digital data string, data conversion means for converting the 1-bit main data of the sampling frequency equal to m×fs (Hz), where m>1, separated by the data separating means, into a quantized k-bit digital signal having a sampling frequency equal to n×fs (Hz), where n is a positive integer smaller than m (m>n), and k is a positive integer larger than 1 (k>1). The data conversion means includes gain adjustment means for maintaining linearity of a converted main data output. The gain adjustment means is controlled on the basis of the effective dynamic information specifying the range of linearity of the main data output contained in the sub-data separated by the data separating means.

With the signal processing apparatus of the present invention, in which main data formed by $\Sigma\Delta$ modulated 1-bit data and subdata are separated from a digital data string made up of a synchronization signal in addition to the above main data and the subdata and the gain setting at the time of downsampling the main data is controlled on the basis of the effective dynamic range information stored in the subdata, the usable dynamic range of the 1-bit digital data outputted by the $\Sigma\Delta$ modulator can be known by a simplified construction, thus assuring high-quality output downsampling data.

DESCRIPTION OF THE PREFERRED EMBODIMENTS

Figure 1:
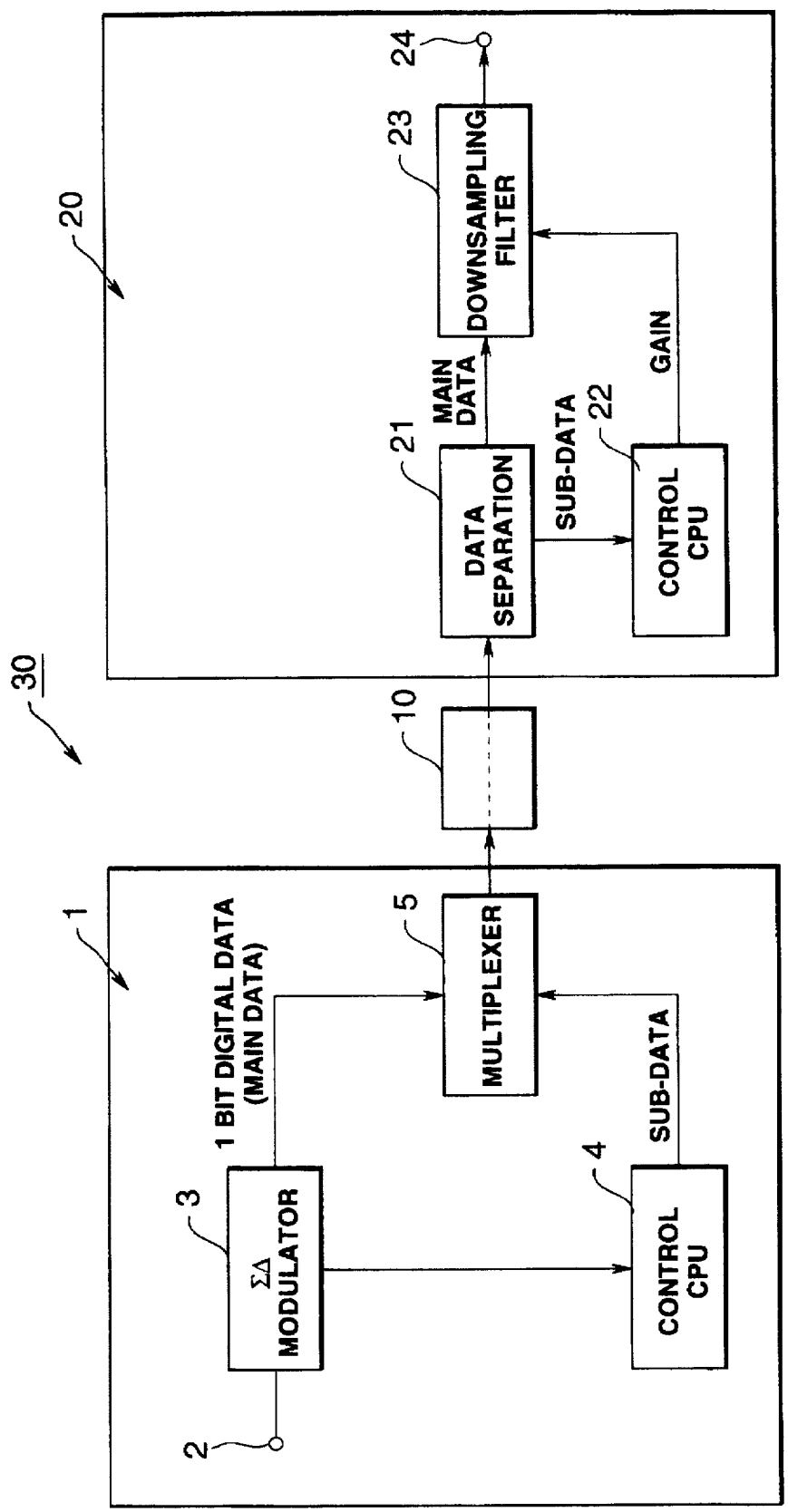
FIG. 1 shows a digital data transmission system according to the present invention.

Referring to the drawings, a preferred embodiment of the present invent ion will be explained in detail.

The embodiment shown in FIG. 1 is a digital data transmission/reception system 30 including a digital data transmission device 1, a transmission/recording unit 10 and a digital data reception device 20.

The present digital data transmission/reception system 30 is a system in which 1-bit digital data, ΣΔ modulated by the digital data transmission device 1, is transmitted/recorded by the transmission/recording unit 10 so as to be received by the digital data reception device 20. Specifically, the digital data transmission/reception system 30 transmits the effective dynamic range information, used when modulating the input signal with ΣΔ modulation to produce 1-bit digital data, as a subcode in a digital data string, along with main data made up of the above 1-bit data, and downsamples the main data into multiple bit digital data with, for example, the sampling frequency of 44.1 Khz and 16 bits, based on the above subcode data extracted from the digital data string.

In the digital data transmission/reception system 30, the digital data reception device 20 receives the above digital data string transmitted/recorded by the transmission/ recording unit 10. The digital data reception device 20 includes a data separator 21 for separating the main data and the subdata from the digital data string, a sampling filter 23 for downsampling the main data separated by the data separator 21, and a central processing unit (CPU) 22 for controlling the gain of the downsampling filter 23 based on the effective dynamic range information contained in the subdata separated by the data separator 21. The operation of the data reception device 20 will be explained subsequently.

The digital data transmission device 1 includes a ΣΔ modulator 3 for ΣΔ modulating an input signal supplied at an input terminal 2 to output 1-bit digital data, and a control CPU 4 for extracting the effective dynamic range information of the ΣΔ modulator 3 for storage thereof in subdata explained subsequently with reference to FIGS. 2 and 3 and for outputting the stored data. The digital data transmission device 1 also includes a multiplexer 5 for synthesizing the subdata from the control CPU 4 and the above 1-bit digital data to form a digital data string which is outputted.

Figure 2:
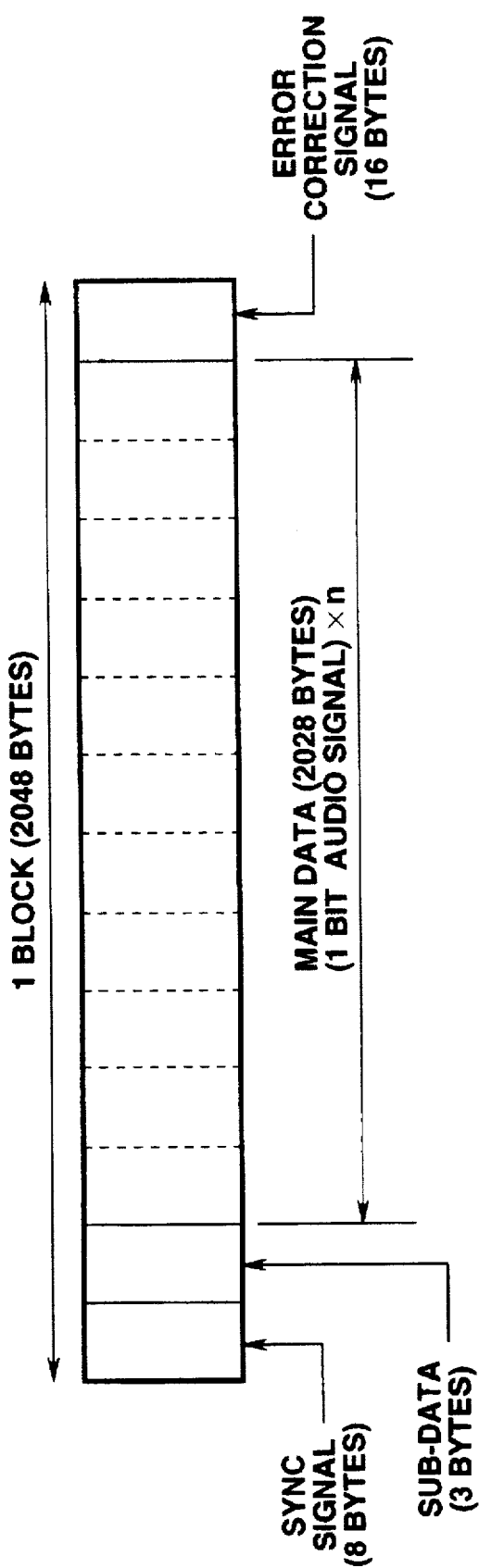
FIG. 2 shows a signal format of a transmitted data string.

Referring to FIG. 2, each block of the digital data string synthesized by the multiplexer 5 is made up of, for example, 2048 bytes, composed of 8 bytes of the synchronization signal, 3 bytes of subdata, 2021 bytes of main data and 16 bytes of error correction signals.

Figure 3:
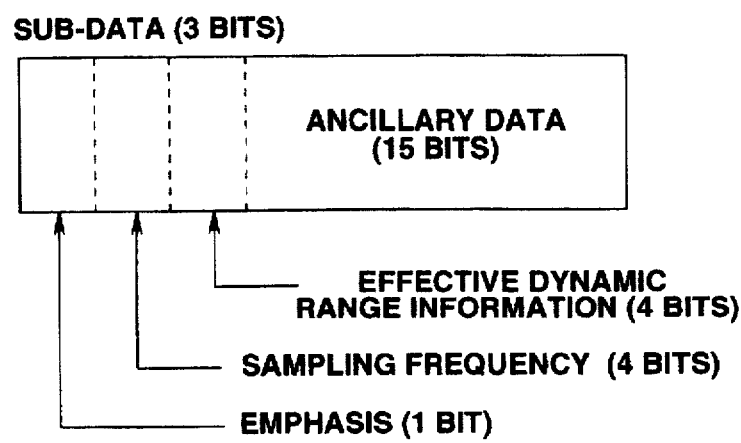
FIG. 3 shows a signal format of sub-data contained in the transmitted data string.

In the sub-data are stored 4 bits of the effective dynamic range information, 4 bits of the sampling frequency fs, 1 bit of the emphasis and 15 bits of ancillary data, as shown in FIG. 3.

The ΣΔ modulator 3 ΣΔ modulates the input signal supplied from the input terminal 2, as described above, and outputs 1-bit digital data.

Figure 4:
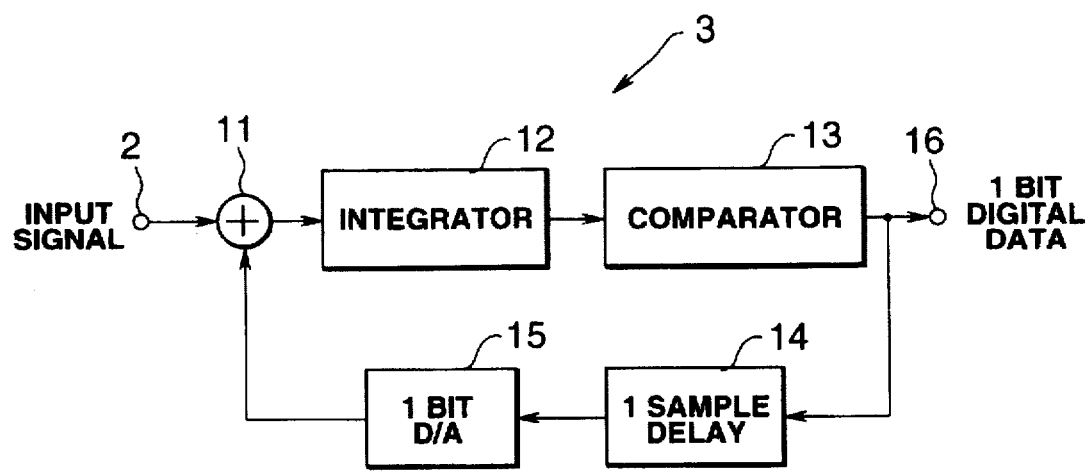
FIG. 4 is a block diagram of a $\Sigma\Delta$ modulator according to the present invention.

FIG. 4 shows this ΣΔ modulator 3 in a detailed block view. In this figure, the input signal from the input terminal 2 is supplied via an adder 11 to an integrator 12, an output of which is sent to a comparator 13 for comparison with a neutral point potential of the input signal. The comparator 13 thus performs one-bit quantization every sampling period to output 1-bit digital data.

This 1-bit digital data, which is the quantized data, is sent to a 1-sample delay unit 14 so as to be delayed one sampling period. This delay data is converted by a 1-bit digital-to-analog converter 15 into an analog signal which is supplied to the adder 11 so as to be summed to the input signal from the input terminal 12. The 1-bit digital data, outputted by the comparator 13, is outputted as main data to the multiplexer 5 via an output terminal 16.

The 1-bit digital data, obtained on ΣΔ modulation by this ΣΔ modulation circuit 3, has a sampling frequency and a word length, such as the sampling frequency of 64 times 44.1 kHz and the data word length of 16 bits, which are respectively significantly higher and shorter than those of the format for multi-bit data hitherto used in the conventional digital audio, such as the sampling frequency of 44.1 kHz and the data word length of 16 bits, and is characterized by a broad transmission frequency range. By this ΣΔ modulation, a high dynamic range can be secured in an audio range which is an extremely low frequency range as compared to the 64-tuple oversampling frequency. This feature can be exploited for data recording or transmission with high sound quality.

The ΣΔ modulation circuit itself is not a new technique and is frequently used as a component of an A/D converter since the circuit structure can be easily designed as an IC and lends itself easily to high-precision A/D conversion.

The modulated 1-bit digital data is passed through a simplified analog low-pass filter on the reproducing side for re-conversion into an analog audio signal.

With the above arrangement of the digital data transmission device 1, the digital data string of FIG. 2, outputted by the multiplexer 5, contains the effective dynamic range information, shown in FIG. 3, so that, by transmitting this digital data string via the transmission/recording unit 10 to the digital data reception device 20, the digital data reception device can take out the effective dynamic range information from the subdata despite its simplified construction.

The effective dynamic range information is now explained.

Figure 5:
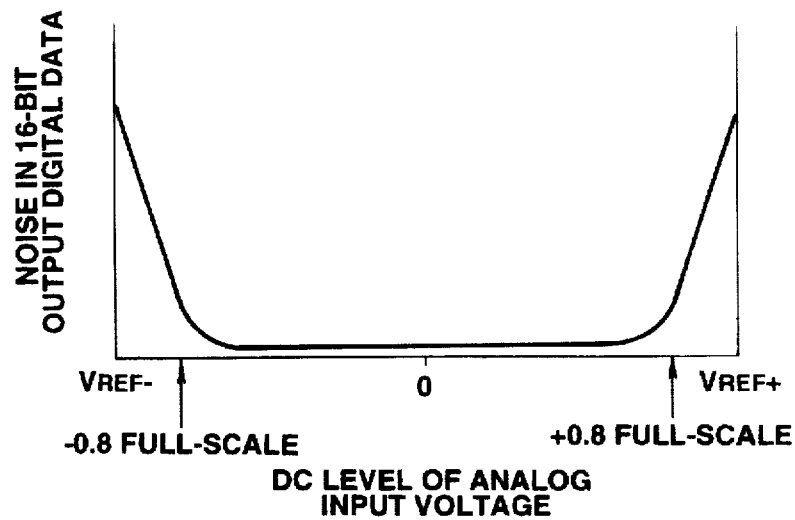
FIG. 5 shows a dynamic range of the $\Sigma\Delta$ modulator.

FIG. 5 shows the dynamic range of an optional ΣΔ modulator. In this figure, an analog DC input to the ΣΔ modulator is plotted on the abscissa, while the noise level in case the 1-bit digital data output of the modulator is downsampled by a digital decimation filter to form a multi-bit (16-bit) signal is plotted on the ordinate. The noise level remains constant for a low analog DC input level, however, if the input level becomes larger to a certain extent the noise is increased abruptly. This point of abrupt noise increase is set as full-scale analog input voltage lower by a pre-set factor (⊡ 0.8) from the maximum feedback reference voltage VREF. This is a technique disclosed in U.S. Pat. No. 4,851,841 entitled "Gain Scaling of Oversampled Analog-to-Digital Converters", and signifies that the DC level is not used up to the maximum level that can be represented by the characteristics of the ΣΔ modulator but the gain is lowered by the downsampling filter. This technique is termed gain scaling and signifies that the gain is scaled to about 80% of the maximum level that can be represented with 1 bit in the case of FIG. 5. This scaling is required for preventing the output from being distorted and for preventing the noise from being worsened for the input signal exceeding the scaled range. That is, the effective dynamic range information may be said to be a linear range in which there is no risk of the output becoming abruptly distorted or the noise becoming worsened.

In the present case, the gain of the downsampling filter is set to (1/0.8)=1.25 for setting the effective dynamic range.

However, since the noise level is increased even at 80%, the reference specifying the scale in % of the voltage level that can be used needs to be unified for various ΣΔ modulators. This reference can be set by the producers of various ΣΔ modulators. Alternatively, the reference point can be set at a point at which a rise in the noise level for a small input is worsened by a few percent Of course this value needs to be set in this case.

Thus, with the present digital data transmission/reception system 30, the digital data transmission device 1 causes the above-mentioned dynamic range information, specifying the range of linearity, to be stored in sub-data and transmits the subdata as a digital data string along with the main data via the transmission/recording unit 10 to the digital data reception device 20. The digital data reception device 20 takes out the dynamic range information by a simplified structure for controlling the gain of the downsampling filter 23 in order to output multi-bit digital data having the sampling frequency of 44.1 kHz and the number of bits equal to 16.

The actual operation of the digital data reception device 20 is hereinafter explained.

The data separator 21 receives the digital data string, transmitted/recorded via the transmission/recording unit 10, and separates the main data and the subdata. The separated subdata is sent to the control CPU 22 where the effective dynamic range information is extracted. The control CPU 22 is responsive to the effective dynamic range information, such as "0.8", and adjusts the gain of the downsampling filter 23 to (1/0.8)=1.25 for controlling the downsampling operation of the main data.

Figure 6:
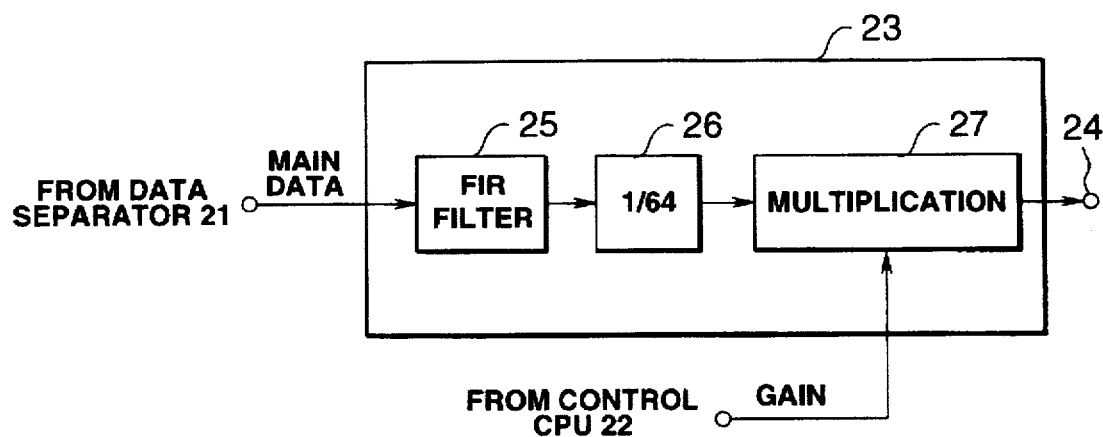
FIG. 6 is a block diagram of a downsampling circuit according to the present invention.

If the sampling frequency of the 1-bit digital data is equal to, for example, 64 times the fundamental sampling frequency of 44.1 kHz, the downsampling filter 23 has a FIR filter 25, a decimator 26 for decimating every 64th data and a multiplier 27 for multiplying the decimated value with a gain from the control CPU 22, as shown in FIG. 6. Thus a multi-bit data, having the sampling frequency of, for example, 44.1 kHz and the number of bits equal to 16, can be outputted at an output terminal 24.

The signal processing apparatus according to the present invention is not limited to the above-described embodiment. If, for example, the recording medium employed for the transmission/recording unit 10 has a separate TOC area, as in the case of a compact disc, the effective dynamic range information can be recorded within the track-based information sub-area in the TOC area.

What is claimed is:

1. A signal processing apparatus for processing a digital data string formed by a synchronization signal, subdata and sigma-delta modulated main data having a sampling frequency equal to m×fs (Hz), where m is a positive integer larger than 1 (m>1) and formed as a 1-bit digital signal, comprising:

data separating means for separating the main data and the subdata from the transmitted digital data string;

data conversion means for converting the 1-bit main data having the sampling frequency equal to m×fs (Hz), where m>1, separated by the data separating means, into a quantized k-bit digital signal having a sampling frequency equal to n×fs (Hz), where n is a positive integer smaller than m (m>n), and k is a positive integer larger than 1 (k>1); wherein said data conversion means includes gain adjustment means for maintaining linearity of a converted main data output;

said gain adjustment means being controlled on a basis of effective dynamic information specifying a range of linearity of the main data output contained in the subdata separated by the data separating means.

2. The signal processing apparatus as claimed in claim 1 wherein the data conversion means further includes an FIR filter and a decimator.

3. The signal processing apparatus as claimed in claim 1 wherein the subdata separated from the transmitted digital data string further includes emphasis information and sampling frequency information.

4. A signal processing method for converting a digital data string formed by a synchronization signal, subdata and sigma-delta modulated main data formed as a 1-bit digital signal and having a sampling frequency equal to m×fs (Hz), where m is a positive integer larger than 1 (m>1), into a quantized k-bit digital signal, having a sampling frequency equal to n×fs (Hz), where n is a positive integer smaller than m (m>n), and k is a positive integer larger than 1 (k>1), comprising the steps of:

separating the main data and the subdata from the transmitted digital data string;

converting the 1-bit main data with the sampling frequency equal to m×fs (Hz), where m>1, separated by the step of separating, into a quantized k bit digital signal having a sampling frequency equal to n×fs (Hz), where n is a positive integer smaller than m (m>n) and k is a positive integer larger than 1 (k>1); and adjusting a gain of the main data output from said step of converting for maintaining linearity of a converted main data output on a basis of effective dynamic information specifying a range of linearity of the main data output contained in the subdata for maintaining linearity of the converted main data output.

* * * * *